United States Patent [19]
Khalifa

[11] 4,180,783
[45] Dec. 25, 1979

[54] PHASE LOCK LOOP DATA TIMING RECOVERY CIRCUIT

[75] Inventor: Jacob R. Khalifa, Mt. Laurel, N.J.

[73] Assignee: RCA Corporation, New York, N.Y.

[21] Appl. No.: 830,855

[22] Filed: Sep. 6, 1977

[51] Int. Cl.² ............................................. H03B 3/04
[52] U.S. Cl. ........................................ 331/2; 331/23; 331/25
[58] Field of Search ...................... 331/1 A, 2, 18, 23, 331/25

[56] References Cited

U.S. PATENT DOCUMENTS

| | | | |
|---|---|---|---|
| 2,627,033 | 1/1953 | Jensen et al. | 331/18 X |
| 3,354,403 | 11/1967 | Thomas | 331/25 X |
| 3,769,602 | 10/1973 | Griswold | 331/18 X |

Primary Examiner—Siegfried H. Grimm
Attorney, Agent, or Firm—Carl V. Olson; Samuel Cohen

[57] ABSTRACT

A phase locked loop including a voltage-controlled oscillator and a divider is used to derive a clock timing signal from a received data stream having a given bit transmission rate. The divider may be programmable so that the circuit can derive a clock from a data stream having any one of a plurality of integrally-related bit rates. A second phase locked loop (having a second programmable divider) is inserted in the feedback path to permit clock recovery from data streams having fractionally-related bit rates.

4 Claims, 1 Drawing Figure

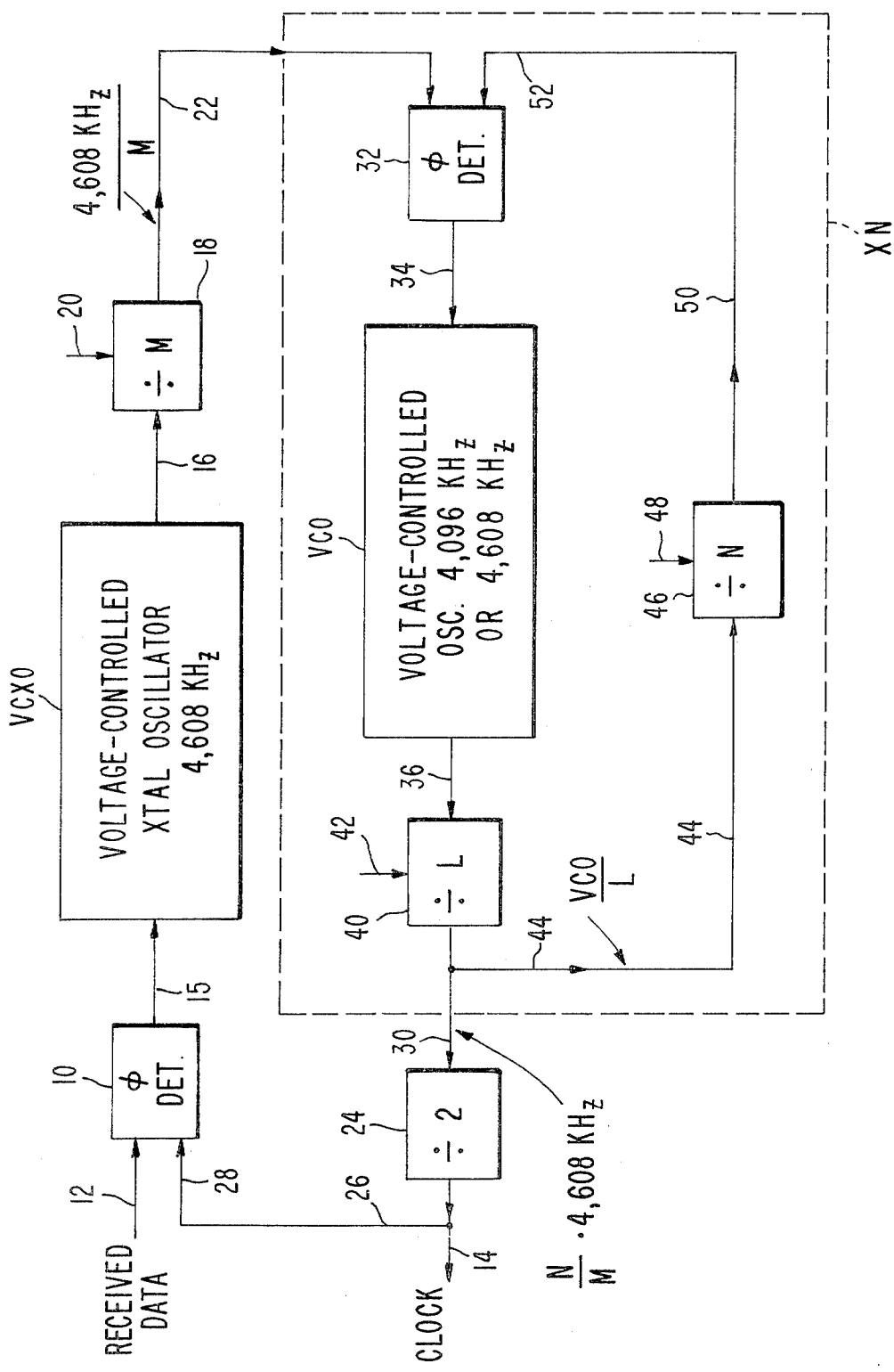

PHASE LOCK LOOP DATA TIMING RECOVERY CIRCUIT

This invention relates to circuits for deriving a clock or timing signal from a received stream of data binary digits (bits) where the transmission occurs under conditions in which the signal may be accompanied by noise and may be subject to fading.

A clock recovery circuit is conventionally constructed of a phase locked loop including a voltage-controlled oscillator and frequency divider having appropriate values to lock onto a received data stream of given bit repetition rate. The divider may be programmable so that the circuit can derive a clock from a data stream having any one of a plurality of bit rates where the higher bit rates are multiples of the lowest bit rate, as, for example, when the bit rates are 72, 144, 288, 576, 1152 and 2304 kilobits per second. When the plurality of bit rates are not integral multiples of the lowest bit rate, more complicated and expensive clock recovery circuits are necessary, as for example, when it is desired to derive clocks from additional data streams of 256, 512, 1024 and 2048 kilobits per second.

According to an example of the present invention, a relatively inexpensive and effective and versatile clock recovery circuit includes a first phase locked loop having a programmable frequency divider, and having a feedback path which includes a second phase locked loop having a second programmable frequency divider.

In the drawing:

The sole FIGURE of the drawing is a block diagram of a clock recovery circuit constructed according to the teachings of the invention.

Referring now in greater detail to FIG. 1, there is shown a phase detector 10 having one input 12 for a stream of received data bits from which a synchronizing clock or timing signal is to be derived and made available on output lead 14. The output of the phase detector 10 is applied over line 15 to a voltage-controlled crystal oscillator designated VCXO having a nominal frequency of 4,608 KHz. The output frequency of the oscillator is capable of being changed a small amount above or below the nominal frequency in response to the voltage-controlled signal applied over line 15. The output of the oscillator VCXO is applied over line 16 to a programmable frequency divider 18 having a program input 20 for determining the divisor M of the divider. The divisor M may be any integer between 1 and 32. The output on line 22 from the divider 18 is a frequency equal to the frequency of oscillator VCXO divided by the divisor M.

The signal on line 22 is applied to a feedback path including a multiplier XN located within a dashed line box, a divide-by-two frequency divider 24, and a line 26 connected back to the reference input 28 of the phase detector 10. The output of the divider 24 on line 14 provides the desired clock square wave cycles in synchronism with the received individual data bits on input line 12.

The frequency multiplier XN within the dashed line box multiplies the frequency of the input signal at 22 by N and delivers the multiplied frequency at 30 to the divider 24. The multiplier XN consists of a phase detector 32 having an input receptive to the signal on line 22, and having an output 34 coupled to a voltage-controlled oscillator VCO having a nominal frequency of 4,352 KHz. The oscillator VCO is made to oscillate at frequencies of 4,352±less than 6%, equal to 4,096 KHz or 4,608 KHz, in response to respective control voltages applied over line 34 from phase detector 32. The small required frequency range is due to the inclusion of a divider 40. The output of oscillator VCO is applied over a line 36 to the programmable frequency divider 40 which is operative to divide the frequency applied thereto by an integral divisor L having a value determined by a command or program supplied thereto over line 42. The described arrangement is cheaper and more compact than an alternative arrangement including two voltage-controlled crystal oscillators oscillating at 4,608 KHz and 4,096 KHz.

The output of divider 40 is applied over line 44 to a programmable divider 46 which is capable of dividing the frequency of the signal applied thereto by an integer N having a value determined by a command supplied thereto over line 48. In the example being described, the divisor L may be any integer between 1 and 32, and the divisor N may be any integer between 1 and 8. The output of the divider 46 is applied over line 50 to the reference input 52 of the phase detector 32.

The phase detectors 10 and 32 may be constituted by Type MC4344 phase-frequency detector and charge pump units manufactured by Motorola. The phase detector 10 includes an output lead-lag active filter which eliminates voltage ripple and determines a narrow loop bandwidth. The phase detector 32 has an output amplifier providing wide loop bandwidth to insure lock-in prior to lock-in of detector 10.

The voltage-controlled crystal oscillator VCXO may be a Type CO-231V narrow-deviation oscillator for phase lock applications manufactured by Vectron Laboratories, Inc.

The frequency dividers 18, 40 and 46 may be synchronous 4-bit counters Type SN74163 manufactured by Texas Instruments.

The voltage-controlled oscillator VCO may be a Type MC4324 voltage-controlled mutivibrator manufactured by Motorola.

The operation of the clock recovery circuit of FIG. 1 will be described with references to Table I which in the left hand column lists the data bit rates of input signals from which it is desired to derive clock signals having the same frequencies. It will be noted that the bit rates in Table I which have asterisks are rates which are integral multiples of the lowest bit rate, which is 72 kilobits per second. However, the data bit rates not marked with an asterisk bear a ratio of 8/9 relative to the bit rate immediately above it in the column. For example, bit rates 2,048 and 2304 have a ratio equal to 8/9. As a consequence, in order to make a clock recovery circuit capable of recovering the clock from data signals having all the listed rates, it would ordinarily be necessary to use a voltage-controlled crystal oscillator having a very high nominal frequency such as 36,864 KHz. The system in FIG. 1 avoids problems associated with the use of such a high frequency oscillator by employing a second phase locked loop XN inserted in the feedback path of the main phase locked loop.

TABLE I

| Bit Rate kb/s | $\frac{VCXO}{M}$ | | VCO | $\frac{VCO}{L}$ | | VCO | $\frac{N}{2M} \cdot VXCO$ |
|---|---|---|---|---|---|---|---|
| | M | KHz | N | KHz | L | KHz | KHz |
| 2304* | 1 | 4608 | 1 | 4608 | 1 | 4608 | 2304 |
| 2048 | 9 | 512 | 8 | 4096 | 1 | 4096 | 2048 |
| 1152* | 2 | 2304 | 1 | 2304 | 2 | 4608 | 1152 |
| 1024 | 9 | 512 | 4 | 2048 | 2 | 4096 | 1024 |

TABLE I-continued

| Bit Rate kb/s | $\frac{VCXO}{M}$ | | $\frac{VCO}{L}$ | | VCO | $\frac{N}{2M} \cdot VXCO$ |
|---|---|---|---|---|---|---|
| | M | KHz | N | KHz | L | KHz | KHz |
| 576* | 4 | 1152 | 1 | 1152 | 4 | 4608 | 576 |
| 512 | 9 | 512 | 2 | 1024 | 4 | 4096 | 512 |
| 288* | 8 | 576 | 1 | 576 | 8 | 4608 | 288 |
| 256 | 9 | 512 | 1 | 512 | 9 | 4608 | 256 |
| 144* | 16 | 288 | 1 | 288 | 16 | 4608 | 144 |
| 72 | 32 | 144 | 1 | 144 | 32 | 4608 | 72 |

When received data is received on line 12 it is assumed that the data bit rate is known and that it is one of the values listed in the left hand column of Table I. Then, in order to derive the clock wave having the same frequency as the data bit rate, the corresponding values of the divisors M, L and N listed in Table I are programmed into the frequency dividers 18, 40 and 46, respectively. When this is done, the clock output 14 has the value indicated in the right hand column in Table I, which is the same as the received data bit rate listed in the left hand column of Table I.

If for example, the received data bit rate is 1,024 kilobits per second applied to phase detector 10, frequency divider 18 is given a divisor M equal to 9, and frequency divider 40 is given a divisor L equal to 2, and frequency divider 46 is given a divisor N equal to 4. The output of divider 18 is 4,608 divided by 9 which is equal to 512 KHz. This signal is applied to the phase detector 32. It is known that when the phase locked loop is in operation, the frequency of the reference signal input at 52 of the phase detector 32 must equal the 512 KHz supplied to the signal input 22 of the phase detector 32. Since 512 KHz is supplied by frequency divider 46 having a divisor N equal to 4, it is known that the signal at the input 44 of divider 46 must be 2,048 KHz, which is listed in Table I in the column headed VCO/L. Since the divisor L of divider 40 is 2, it is known that the voltage-controlled oscillator VCO has a frequency of 2,048×2 or 4,096 KHz. The 2,048 KHz signal at 44 and at the output 30 of the frequency multiplier XN is divided by 2 in divider 24 to provide an output clock wave at 14 of 1,024 KHz, which is the same as the input data bit rate of 1,024 kilobits per second.

It can be seen that by programming the three dividers with the appropriate divisors, the clock recovery circuit can produce a desired clock wave for any one of the ten listed input data bit rates.

It should be noted that the divider 18 in the feedback path of the main phase locked loop divides the frequency it receives by M, and that the second phase locked loop XN includes a divider 46 in its feedback path which causes the frequency received by the second phase locked loop XN to be multiplied by N (512×4=2,048 KHz in the foregoing example). The result is that the frequency from the voltage-controlled crystal oscillator VCXO is divided by the divisor M and by 2, and is multiplied by the divisor N, so that the output clock is the ratio N/2 M times the frequency of oscillator VCXO, as shown in the last column of Table I. It is thus seen that the clock recovery or timing extraction circuit is capable of locking onto received data bits having a bit repetition rate related to the frequency of oscillator VXCO by the ratio or fraction N/M, where each of N and M are integers. The circuit does not have the restriction of dividing only by an integer.

It will of course be understood that the frequency and divisor values given herein are for purposes of illustrating a specific example of the invention, and not by way of limiting the invention.

What is claimed is:

1. A phase locked loop, comprising
   a phase detector having a signal input and a reference input,
   a voltage-controlled oscillator responsive to the output of said phase detector,
   a feedback loop from said oscillator to the reference input of said phase detector,
   a divider in said feedback loop to divide the frequency by an integer, and
   a programmable multiplier in said feedback loop to multiply the frequency by an integer, said programmable multiplier consisting of a phase locked loop including a divider in its feedback path.

2. The combination of claim 1 wherein said dividers are programmable dividers.

3. Means for deriving timing signals from received data signals having fractionally related bits-persecond rates, comprising
   a phase detector having a data signal input and a reference signal input,
   a voltage-controlled crystal oscillator responsive to the output of said phase detector,
   a feedback loop from said oscillator to said reference signal input of said phase detector,
   a programmable divider in said feedback loop to divide the frequency by an integer, and
   a programmable multiplier in said feedback loop to multiply the frequency by an integer, said programmable multiplier being constituted by a second phase lock loop having a feedback path including a programmable divider;
   whereby the divider and multiplier can be programmed to produce a timing reference signal synchronized with a received data signal having a given data rate.

4. The combination defined by claim 3 wherein said second phase locked loop includes a voltage-controlled oscillator.

* * * * *